(12) United States Patent  
Johnson et al.

(10) Patent No.: US 6,878,901 B2  
(45) Date of Patent: Apr. 12, 2005

(54) LASER MICROMACHINING AND ELECTRICAL STRUCTURES FORMED THEREBY

(75) Inventors: Morgan T. Johnson, Portland, OR (US); William A. Miller, Vancouver, WA (US)

(73) Assignee: Morgan Miller Technologies LLC, Washougal, WA (US)

( * ) Notice: Subject to any disclaimer, the term of this patent is extended or adjusted under 35 U.S.C. 154(b) by 0 days.

(21) Appl. No.: 10/850,021

(22) Filed: May 19, 2004

(65) Prior Publication Data

US 2004/0222202 A1 Nov. 11, 2004

Related U.S. Application Data

(63) Continuation of application No. 10/076,178, filed on Feb. 12, 2002, now abandoned.
(60) Provisional application No. 60/268,382, filed on Feb. 12, 2001, provisional application No. 60/277,118, filed on Mar. 19, 2001, and provisional application No. 60/277,349, filed on Mar. 19, 2001.

(51) Int. Cl.[7] ........................... B23K 26/00; B23K 26/14
(52) U.S. Cl. ............................. 219/121.69; 219/121.71; 219/121.76
(58) Field of Search ...................... 219/121.61, 121.69, 219/121.76, 121.78, 121.85, 121.71; 438/706, 720

(56) References Cited

U.S. PATENT DOCUMENTS

| 5,593,606 | A | * | 1/1997 | Owen et al. | 219/121.71 |
| 5,614,114 | A | * | 3/1997 | Owen | 219/121.66 |
| 5,841,099 | A | * | 11/1998 | Owen et al. | 219/121.69 |
| 6,048,755 | A | * | 4/2000 | Jiang et al. | 438/118 |
| 6,376,769 | B1 | * | 4/2002 | Chung | 174/52.2 |

* cited by examiner

Primary Examiner—Duy-Vu N. Deo
(74) Attorney, Agent, or Firm—Raymond J. Werner

(57) ABSTRACT

A unified process of making an electrical structure includes performing a plurality of laser etching operations on a workpiece, without removing the workpiece from a laser processing system. The workpiece includes a conductive material disposed on an electrically insulating substrate, and the plurality of laser etching operations include, but are not limited to, two or more of forming a fiducial, forming thick metal traces separated by high aspect ratio spaces, cutting an alignment hole, cutting a folding line, and singulating the electrical structure. In another aspect of the invention, a database is prepared, and communicatively coupled to the laser processing system to provide control signals that direct a portion of the plurality of operations of the laser processing system, wherein each plurality of etching operations is defined with respect to a common coordinate system.

31 Claims, 5 Drawing Sheets

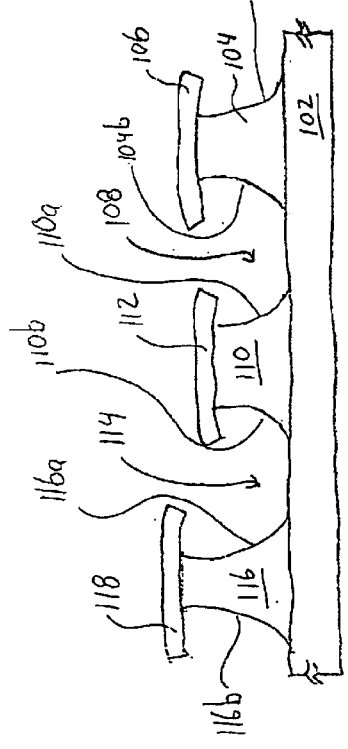
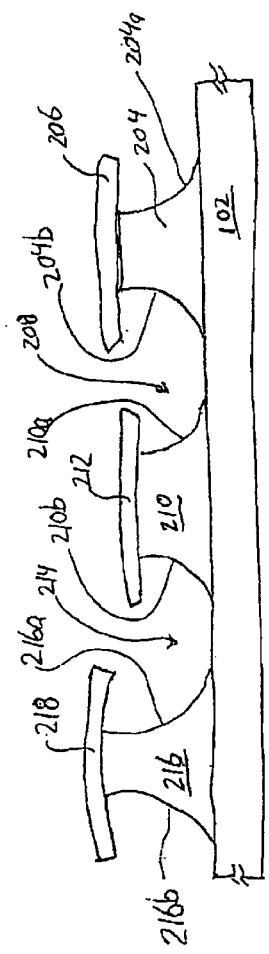
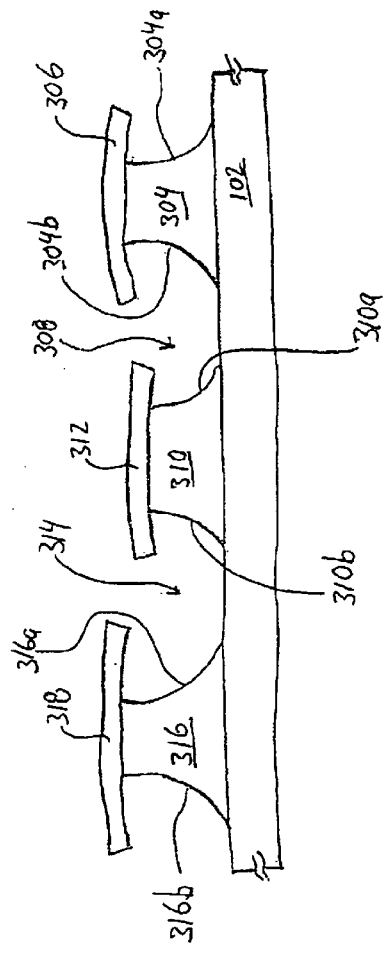

LASER MICROMACHINING AND ELECTRICAL STRUCTURES FORMED THEREBY

RELATED APPLICATIONS

This application is a continuation of application Ser. No. 10/076,178, entitled "Laser Micromachining And Electrical Structures Formed Thereby", which was filed Feb. 12, 2002, now abandoned which claimed the benefit of earlier filed provisional application Ser. No. 60/268,382 which was filed Feb. 12, 2001; provisional application Ser. No. 60/277,118 which was filed Mar. 19, 2001, and provisional application Ser. No. 60/277,349 which was filed Mar. 19, 2001.

BACKGROUND OF THE INVENTION

1. Field of the Invention

The methods and apparatus of the present invention relate generally to the fabrication of electrical structures by laser etching, and more particularly to the fabrication of high line-density structures having high aspect ratio spaces between relatively large cross-section conductors.

2. Background

Electrical systems very typically include a variety of electrical components mounted upon, or otherwise attached to a substrate. Such a substrate provides mechanical support for component attachment as well as commonly provides a variety of electrically conductive pathways thereon for electrically coupling the various electrical components. One example of such a substrate is the printed circuit board.

Printed circuit board (PCB) technology has been in development for many years. The electrically conductive pathways, or traces, found on printed circuit boards are conventionally formed by processes in which a blanket layer of conductive material, typically copper, is masked and then chemically etched (i.e., wet etched) such that portions of the copper under the mask pattern remain on the board while the exposed portions are removed. However, the conventional wet chemical etch process is an isotropic etch resulting in the traces having sidewalls with curved, or sloping shapes (i.e., not substantially parallel to each other). Another way of describing this geometrical characteristic is that the traces have relatively wide portions immediately adjacent the substrate, and that the traces narrow in width as they extend away from the surface of the substrate. Unfortunately, these isotropic etch results, have adverse consequences for the electrical characteristics of the traces. More particularly, these undesirably formed traces, provide unpredictable resistance and capacitance values as interconnect lines.

Referring to FIGS. 1, 2, and 3, illustrations of the undesired results of conventional wet etching of tin masked copper lines are shown. It is noted that across a typical panel, that is, a substrate or board, it is not uncommon for the plated thickness of copper to vary by plus or minus 12 microns. As can be seen in FIGS. 1–3, several examples of isotropically etched copper traces are shown. FIG. 3 illustrates the results of conventional manufacturing practices in producing features that are nominally 150 microns wide. In addition to sloping sidewalls, it can be seen that the actual feature sizes achieved varies with the varying thickness of copper across the panel. More particularly, trace 304, which was formed in a region of nominal copper thickness, can be seen to be narrower than trace 310, which was formed in a region of less than nominal copper thickness, whereas trace 304 is wider than trace 316, which was formed in a region of greater than nominal copper thickness. FIG. 2 is similar to FIG. 3, but illustrates the results of conventional manufacturing practices in producing features that are nominally 125 microns wide. In addition to the undesirable sloping sidewalls, it can be seen that the actual feature sizes achieved varies with the varying thickness of copper. More particularly, trace 204, which was formed in a region of nominal copper thickness, can be seen to be narrower than trace 210, which was formed in a region of less than nominal copper thickness, whereas trace 204 is wider than trace 216, which was formed in a region of greater than nominal copper thickness. Finally, it can be seen that FIG. 1 illustrates the results of conventional manufacturing practices in producing features that are nominally 100 microns wide, at which point the overetching seen in the thick copper regions produces trace widths which generally tend to be unacceptably narrow, and are usually unworkable for very high speed applications. Still referring to FIG. 1, in addition to undesirable sloping sidewalls, it can be seen that the actual feature sizes achieved varies with the varying thickness of copper. Trace 104, which was formed in a region of nominal copper thickness, can be seen to be narrower than trace 110, which was formed in a region of less than nominal copper thickness, whereas trace 104 is wider than trace 116, which was formed in a region of greater than nominal copper thickness. FIGS. 1–3 illustrate the difficulties encountered in forming traces by conventional methods. This problems are grow worse as the dimensions sought to be achieved grow smaller.

Although printed circuit boards have been used to illustrate the problems encountered in conventional manufacturing of traces, such problems are found in a wide variety of products including space transformers, chip packages, and the like.

What is needed are electrical structures, suitable for products such as the space transformer, where those products have thick metal for current carrying capacity, and high aspect ratio spaces therebetween to provide a high density of conductors per linear measurement unit, and methods for the manufacture of such electrical structures.

SUMMARY OF THE INVENTION

Briefly, a unified process of making an electrical structure includes performing a plurality of laser etching operations on a workpiece, without removing the workpiece from a laser processing system. The workpiece includes a conductive material disposed on an electrically insulating substrate, and the plurality of laser etching operations include, but are not limited to, two or more of, forming a fiducial, forming thick metal traces separated by high aspect ratio spaces, forming an alignment hole, forming a folding line, forming a cutting line, and singulating the electrical structure.

In further aspect of the present invention, a database is prepared, and communicatively coupled to the laser processing system to provide control signals that direct a portion of the plurality of operations of the laser processing system, wherein each of the plurality of etching operations is defined with respect to a common coordinate system.

In a still further aspect of the present invention, an electrical structure in accordance with the present invention, provides the function of a space transformer.

BRIEF DESCRIPTION OF THE DRAWINGS

FIG. 1 is a cross-sectional representation of a conventionally etched, thick metal, set of traces disposed on a substrate, where the desired nominal trace width is 100 microns.

FIG. 2 is a cross-sectional representation of a conventionally etched, thick metal, set of traces disposed on a substrate, where the desired nominal trace width is 125 microns.

FIG. 3 is a cross-sectional representation of a conventionally etched, thick metal, set of traces disposed on a substrate, where the desired nominal trace width is 150 microns.

DETAILED DESCRIPTION

Generally, in accordance with the present invention, methods of laser etching to remove portions of one or more materials from a workpiece, are used to produce electrical structures characterized by conductive traces disposed on an electrically insulating substrate, the conductive traces separated from one another by high aspect ratio spaces. Spaces may be thought of as openings in the materials that are superjacent the substrate. These conductive traces are typically formed of copper of the "thick metal" variety, i.e., typically between about 9 microns and about 72 microns in thickness. These electrical structures may alternatively be characterized as having a high density of conductive traces relative to the high aspect ratio spaces that separate the conductive traces. The substrates may be of the rigid or flex variety, and may be comprised of organic or inorganic materials. The substrates may have a conductive material on one side only, or may be more complex such as with conductive material on two opposing major surfaces and/or with conductive traces disposed within the substrate itself (sometimes referred to as a complex substrate).

Electrical structures in accordance with the present invention advantageously provide metal traces of substantially constant width with respect to a specified nominal width, and spaces of substantially constant width with respect to a specified nominal width, as compared to conventionally prepared thick metal traces on rigid or flexible substrates. Such substantially constant width traces may have varying thicknesses as the thickness of the metal varies across a workpiece. Alternatively, embodiments of the present invention may include machining the workpiece such that in addition to constant width and constant space, the traces have constant thickness. It will be appreciated that with respect to expressions such as constant width, or space, or thickness, what is meant is that the variations in width, space, or thickness, are so small as to be negligible, particularly as compared to the magnitude of the variations resulting from the application of conventional wet etching processes of forming traces and spaces. Electrical structures in accordance with the present invention include, but are not limited to, space transformers, single-chip packages, and multi-chip packages.

Figure 4:
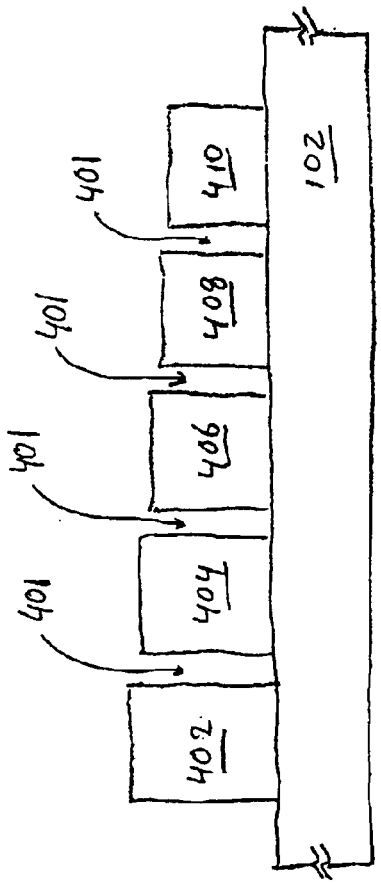
FIG. 4 is a cross-sectional representation of thick metal traces, in accordance with the present invention, having substantially constant trace width, having varying trace thickness, having trace sidewalls that are substantially perpendicular to the substrate, and having substantially constant space width.
Figure 5:
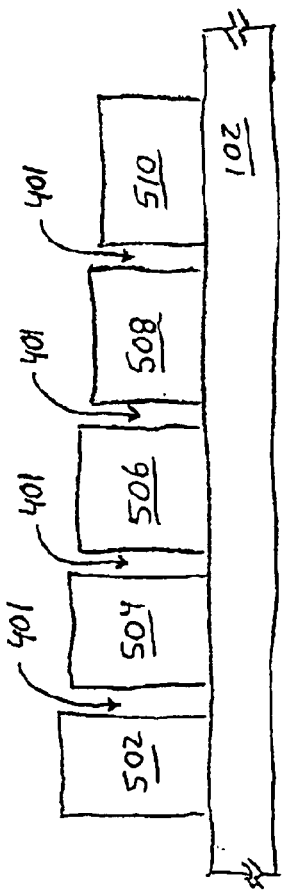
FIG. 5 is a cross-sectional representation of thick metal traces, in accordance with the present invention, having substantially constant trace cross-sectional areas, having trace sidewalls that are substantially perpendicular to the substrate, and having substantially constant space width.
Figure 6:
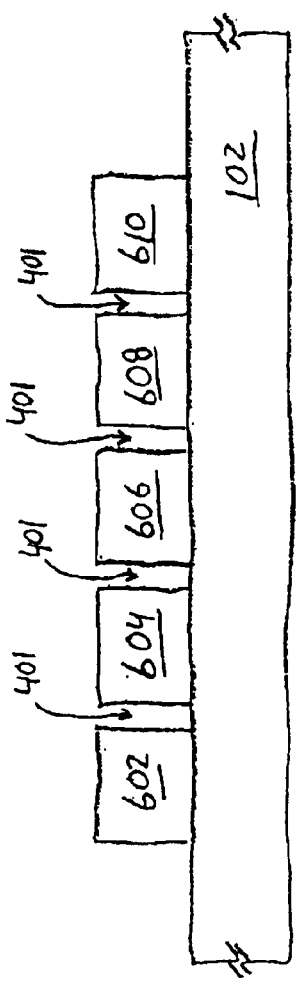
FIG. 6 is a cross-sectional representation of thick metal traces, in accordance with the present invention, having substantially constant trace width, having substantially constant trace thickness, having trace sidewalls that are substantially perpendicular to the substrate, and having substantially constant space width.

FIGS. 4–6 show exemplary cross-sectional views of traces formed in accordance with embodiments of the present invention. More particularly, FIG. 4 is a cross-sectional representation of thick metal traces 402, 404, 406, 408, and 410, in accordance with the present invention, having substantially constant trace width 401, having varying trace thickness, having trace sidewalls that are substantially perpendicular to the substrate, and having substantially constant space width. As can be seen from the figure, trace width 401 is substantially constant even though the heights (i.e., thicknesses) of traces 402, 404, 406, 408, and 410 are not the same. FIG. 5 is a cross-sectional representation of thick metal traces 502, 504, 506, 508, and 510, in accordance with the present invention, having substantially constant trace cross-sectional areas, having trace sidewalls that are substantially perpendicular to the substrate, and having substantially constant space width 401. In other words, the pitch of the traces is modified in accordance with the thickness of the metal layer so as to achieve substantially constant cross-sectional area, which in turn, relates to the effective resistance of each trace. FIG. 6 is a cross-sectional representation of thick metal traces 602, 604, 606, 608, and 610, in accordance with the present invention, having substantially constant trace width 401, having substantially constant trace thickness, having trace sidewalls that are substantially perpendicular to the substrate, and having substantially constant space width. The structure of FIG. 6 may be obtained by laser etching spaces in a substantially uniformly thick starting layer of metal, or by creating the structure of FIG. 4, and machining the traces to planarize the top surface thereof.

In the following description, various aspects of the present invention will be described. However, it will be apparent to those skilled in the art that the present invention may be practiced with only some or all aspects of the present invention. For purposes of explanation, specific numbers, materials and configurations are set forth in order to provide a thorough understanding of the present invention. However, it will also be apparent to one skilled in the art that the present invention may be practiced without those specific details. In other instances, well-known features are omitted or simplified in order not to obscure the present invention.

Reference herein to "one embodiment", "an embodiment", or similar formulations, means that a particular feature, structure, operation, or characteristic described in connection with the embodiment, is included in at least one embodiment of the present invention. Thus, the appearances of such phrases or formulations herein are not necessarily all referring to the same embodiment. Furthermore, various particular features, structures, operations, or characteristics may be combined in any suitable manner in one or more embodiments.

Terminology

The expressions, laser cutting, laser editing, laser etching, laser machining, laser micro-machining, laser processing, laser scribing, and similar terms and expressions are sometimes used interchangeably. As used herein, these expressions refer to a process of removing material from a workpiece by exposing that workpiece to the output of a laser.

The terms conductive line, metal line, conductive trace, interconnect line, wire, conductor, signal path and signaling medium are all related. The related terms listed above, are generally interchangeable. In this field, and in connection with the electrical structures referred to herein, electrically conductive metal lines are typically referred to as traces.

The expression, space transformer, refers to an electrical structure that is used to achieve electrical connection between one or more electrical terminals that have been fabricated at a first scale, or dimension, and a corresponding set of electrical terminals that have been fabricated at a second scale, or dimension. In this field, a space transformer is sometimes referred to as a fan-out. A space transformer, or fan-out, essentially provides an electrical bridge between the smallest features in one technology (e.g., pins of a probe card) and the largest features in another technology (e.g., bonding pads of an integrated circuit). An interposer may also be referred to as a space transformer.

The term, space, as used herein, generally refers to a space between electrically conductive traces. Terms such as, trenches, gaps (air gaps if no other dielectric material is introduced therein), or slots, may also be used to refer to those regions between conductors. The height of a space, unless specifically noted otherwise, is considered to be equal to the height of the surrounding electrically conductive material that defines the space.

The thickness of a conductive layer is sometimes referred to in this field in terms of ounces (oz.). This is based on the weight of one square foot of a conductive layer of a particular material and thickness. For example, a thickness referred to as 0.5 oz. copper, is approximately 18 microns thick. Similarly, a thickness referred to as 1.0 oz. copper, is approximately 36 microns thick, and so on.

Overview

In one aspect of the present invention, electrical structures are made by laser etching, and all of those laser etching operations take place, from beginning to end, within a single laser etching system, via one or more selectively controlled, appropriate laser beams, or pulses, which are directed toward what is, initially, i.e., before laser etching, a blanket layer of electrically conductive material, such as, but not limited to, a layer of copper. More particularly, by performing a variety of etching operations, such as for example, those that form fiducials, those that form isolated conductive traces from the blanket layer of conductive material, those that cut alignment holes, those that form cutting and folding lines, and those that act to singulate one or more completed electrical structures, within a single laser etching system, and using a unified coordinate database to define, or describe, these operations, the error budget for laser processing is reduced, thereby providing a methodology for obtaining tighter pitches, greater densities, and enhanced accuracy.

Process integration, in accordance with the present invention, includes combining multiple separate conventional process operations, typically performed by separate machines, or tools, into one process, performed in an uninterrupted manner, within a single machine, and with each element within the process being referenced to a single common coordinate system. Such process integration eliminates many of the workpiece alignment operations required by previous methods, thereby advantageously improving accuracy. In some embodiments of the present invention, no realignment operations of the workpiece are performed, yet multiple operations are performed on the workpiece. Furthermore, this improved positional accuracy allows laser etching operations to be repeated such that "fine-tuning", or "touch-up" edits may be made. Process integration in accordance with the present invention eliminates most or all of the conventional realignment operations that result in an inability to repeat a laser etching pass. Put another way, embodiments of the present invention, by virtue of the improved positional accuracy resulting from elimination of one or more realignment operations, may include multiple laser etching passes over some or all of the exposed surface of a workpiece.

Laser control is effected in such a fashion that, within this environment, a defined pattern of differentiated conductors, which may have many different shapes, spacings, and organizations, is created through what can be thought of as precision laser micro-machining that removes material to create separating gaps, thereby forming individual conductive traces. Experience and practice with the invention has demonstrated the ability of this laser fabrication approach to create unique patterns of conductors, including patterns with an extremely high area-density of conductors, characterized by cross-sectional and spatial-separation aspect ratios that afford an opportunity for the creation of unique inter-conductor electrical characteristics which offer advantages in a number of different applications, including space transformer applications. Laser micro-machining, performed in accordance with the present invention, is capable of producing confronting conductive walls, in regions where conductive material is removed, that are substantially precisely planar, accurately and precisely positioned relative to one another, and defined by facing wall expanses which have a material height relative to the supporting plane of a joined substrate which cannot be achieved by conventional etching. Conventional etching, as is well known, produces undercutting of material during the removal process.

In some embodiments of the present invention, the integrated process includes laser etching bar codes on the workpiece by removing portions of, at least, the conductive material. Such bar code etching may be formed at a size wherein magnification via an optical instrument such as a microscope is required to read the bar code, or the bar code may be formed at a human readable scale. It is noted that in addition to bar codes, any other graphical coding system or character set may be used, wherein various graphical symbols or character set elements are formed on the workpiece as part of the integrated process flow in accordance with the present invention. Similarly, in some embodiments of the present invention, the integrated process includes laser etching alphanumeric text characters of microscopic or human readable dimension into the workpiece.

Illustrative Process Examples

In an illustrative embodiment of the present invention, laser pulses are used to "edit" a blanket layer of conductive material disposed on a first side, or surface, of an electrically insulating substrate, so as to form conductive traces thereon. That is, conductive traces are produced by the creation of spaces, which result from the laser editing process. More particularly, in this illustrative embodiment, the laser pulses remove a portion of the total amount of electrically conductive material that is desired to be removed with each pulse. In this way, several pulses are required to completely etch out the space so that two adjacent conductive traces are not electrically shorted together. The space is therefore considered to be etched out when the application of laser energy has removed the conductive material down to the insulating substrate. It is desirable to form the spaces such that the conductive traces have sidewalls that are perpendicular, or substantially perpendicular, to the substrate, smooth, and evenly spaced apart from one another along the length of the space, and further desirable to avoid damaging, i.e., unintentionally removing portions of the underlying substrate, or to unintentionally change the electrical characteristics of the underlying substrate.

It is noted that in some instances, an adhesive material is disposed between the conductive material and the substrate so as to provide for improved adhesion of the metal traces to the insulating substrate material.

Typically, the conductive material is a metal, such as, but not limited to, copper. Further, the thickness and type of the conductive material is typically known, or determined, prior to laser etching the spaces so that the laser energy, pulse width, and relative velocity of the laser spot with respect to the workpiece, can be properly set. In typical embodiments of the present invention, the laser spot diameter is in the range of 18 microns to 25 microns; the laser spot scan rate is in the range of 20 mm/sec to 40 mm/sec; the laser beam wave length is in the range of 266 nm to 355 nm; the pulse energy is in the range of 10 to 50 microjoules; the pulse width (half height) is in the range of 15 to 30 ns; and the pulse rate is approximately 10 kHz.

In some instances it may be desirable to form a trench in the substrate. Typically, such a trench immediately underlies the space between two conductive traces. In one embodiment of the present invention, such a trench in the substrate is formed essentially concurrently with the formation of an overlying space. That is, once the overlying conductive material is removed, the pulsed laser energy is used to continue removing material at those coordinates until a trench in the substrate of a desired depth is reached.

It is noted that by removing such portions of the substrate, the capacitance between two adjacent conductive traces is changed. More particularly, the capacitance is typically reduced because the dielectric constant of air is typically less than that of the insulating portion of the substrate which was removed. In alternative embodiments of the present invention, portions of the trench; the whole trench; the whole trench and portions of the space superjacent the trench; the whole trench and the whole space superjacent the trench, or any similar combination, may be backfilled with one or more dielectric materials, such that the capacitance between adjacent traces may be adjusted. In such embodiments the dielectric material may have a dielectric constant that is greater than that of the substrate material. It is further noted, that in those instances where an adhesive is disposed between the metal and the substrate, the formation of a trench in the substrate includes laser etching a portion of the adhesive. In various embodiments of the present invention wherein the workpiece includes the adhesive layer, it is possible to etch combinations of adhesive only, and adhesive and substrate material.

In addition to preparing traces and spaces by way of laser etching, various embodiments of the present invention include forming, again by way of laser etching, one or more fiducials, alignment holes, cutting lines, folding lines, and may further include singulation of a laser-edited product from its surrounding or supporting substrate.

Fiducials, or fiducial marks, are sometimes referred to targets because they are target images which are searched for, and recognized by, machine vision systems, or human operators. In one illustrative example, fiducial marks on a printed circuit board are recognized by a machine vision system, and such system communicates with associated handling equipment such that subsequent manufacturing operations are properly achieved. Fiducials, whether on a printed circuit board or other type of substrate may be formed in accordance with the present invention by laser etching portions of a conductive layer on that substrate so as to form a recognizable, pre-determined target image. In other embodiments, formation of fiducials may include laser etching portions of the substrate material, including, in some embodiments, even etching all the way through a substrate. In accordance with the present invention, formation of one or more fiducials, is accomplished by laser etching, typically in multiple passes, within a single laser etching system, in conjunction with the formation of one or more other laser-etched features wherein the workpiece is not removed from the laser etch system.

Alignment holes are used, after an electrical structure in accordance with the present invention is formed, to provide mechanical alignment with another mechanical element, whereby alignment pins, which are attached to the other mechanical element, are received through the alignment holes, thereby bringing the electrical structure into a predetermined mechanical alignment with that other mechanical element. Alignment holes may be formed in accordance with the integrated process of the present invention by laser etching a hole of predetermined dimension through the conductive material, through the adhesive material if such is present, and through the substrate. Formation of the hole may be accomplished by removing all the material by application of laser energy, or by forming, for example, an annular region of removed material such that the remaining material, interior to the annular region is singulated, i.e., removed from the workpiece. Alignment holes are typically, but not required to be, circular. Alignment holes formed in accordance with the present invention provide improved tolerances, and therefore better mechanical alignment with other mechanical objects than can be obtained by conventional methods of forming alignment holes, such as drilling or routing.

Folding lines are regions of a workpiece that have been removed to facilitate physically folding the electrical structure subsequent to the laser etching of integrated process in accordance with the present invention. Folding lines may be formed in accordance with the present invention by removing portions of the conductive material, similar to forming a space, or may include removing portions of the conductive material so as to form a "dotted" line which facilitates folding. Formation of the dotted folding lines may also include removing regions of the substrate underlying the portions of conductive material removed for the purpose of defining, forming, the folding lines.

Cutting lines are similar to folding lines, but are typically formed continuously, that is, not in "dotted" lines, and are used to remove one or more sections from the workpiece. These are formed in accordance with the integrated process of the present invention by laser etching.

Singulation refers to the process of separating a laser-edited electrical structure from the substrate from which it was formed. Singulation may be achieved in accordance with the present invention by laser etching a "border" which defines the outer dimensions of the electrical structure. Singulation etching may be done completely around the electrical structure, or may be done in a partial manner such that one or more tabs remain. Such tabs provide a means of maintaining the electrical structure in place relative to the substrate from which it was formed. In embodiments in which tabs remain, the electrical structure is typically removed from the surrounding substrate by a mechanical twisting operation, although, any suitable method, including, but not limited to laser etching of the tabs, may be used.

Passivation removal refers to removing portions of an electrically insulating layer that overlies the conductive layer which is disposed on a surface of substrate. More particularly, a workpiece includes a substrate and a copper layer disposed thereon. The copper layer has an insulator, such as but not limited to, polyimide, disposed on the copper layer. In some embodiments of the integrated process of the present invention, subsequent to the formation of traces, which includes removing polyimide and copper, additional regions of polyimide are removed (referred to as passivation opening) so that electrical contact to a portion of the copper may be had. Passivation opening, in accordance with the present invention, is performed without removing the workpiece from the laser etching system, and without realigning the workpiece.

Figure 7:
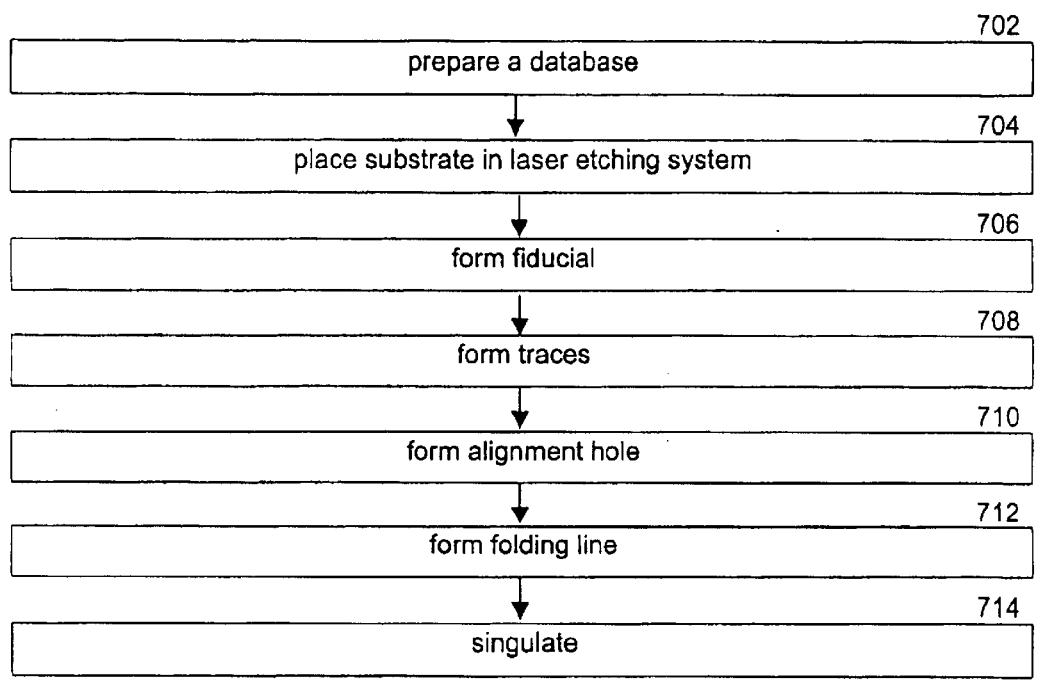
FIG. 7 is a flowchart of an illustrative process in accordance with the present invention.

FIG. 7 illustrates one embodiment of the integrated process of the present invention. More particularly, a method of making an electrical structure, includes preparing a database 702. This includes providing information regarding the geometrical description of the various portions of the workpiece to be removed by the laser etching system. Each of the various elements formed, for example traces, fiducials, alignment holes, trenches, passivation openings, etc. are defined with respect to a common, or unified coordinate system. Because the workpiece is not removed from the laser etching system, no realignment of the workpiece is performed and the coordinates of each geometrical description remain defined within the uninterrupted coordinate reference system. The substrate is placed 704 in a first laser processing system, and the substrate is made from an electrically insulating material, and a first blanket layer of conductive material is disposed on a first surface thereof. At least one fiducial is formed 706 by laser etching. Portions of the conductive material are removed 708 by laser etching so as to form isolated conductive traces. At least one alignment hole suitable for receiving therethrough at least one alignment pin is formed by laser etching 710. At least one folding line is formed by laser etching 712. The electrical structure formed by the various laser etching operations that take place without removal from the laser etching system and without realignment of the workpiece, is then singulated 714.

Figure 8:
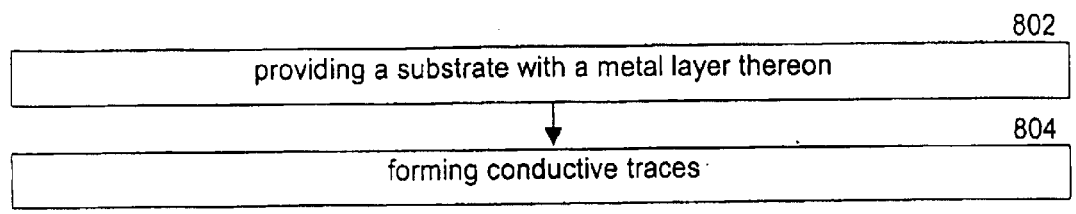
FIG. 8 is a flowchart of an alternative illustrative process, in accordance with the present invention.

FIG. 8 illustrates one embodiment of the integrated process of the present invention. In this illustrative embodiment, a method of making an electrical structure, includes providing 802 an insulating substrate that has a first major surface and a second major surface on an opposite side, and that has a layer of metal disposed on the first major surface. The substrate may be rigid or flexible, it may be a simple or complex, and may be made of FR-4, polyimide, epoxy, or any other material suitable for use as a substrate for an electrical product. At least one portion of the layer of metal is removed 804 by laser etching so as to form at least one trace and at least one space adjacent thereto. In this illustrative embodiment, the at least one trace has a height, a width, and a first aspect ratio (height/width); and the at least one space has a height, a width, and a second aspect ratio (height/width), and the second aspect ratio is greater than the first aspect ratio.

Figure 9:
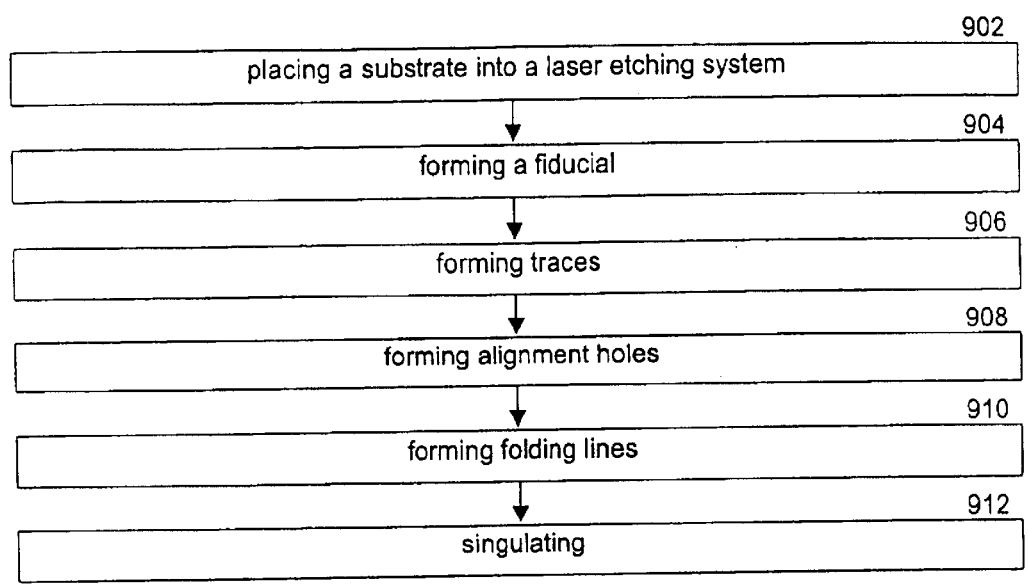
FIG. 9 is a flowchart of another alternative illustrative process, in accordance with the present invention.

FIG. 9 illustrates one embodiment of the integrated process of the present invention. In this illustrative embodiment of the present invention, a method of forming a space transformer, includes placing 902 a substrate with a first major surface and a second major surface, the substrate comprising an electrically insulating material, and a first layer of material disposed on the first major surface, into a first pulsed laser etching system. Etching 904, with the first pulsed laser etching system, portions of the first layer and portions of the substrate to form at least one fiducial. Without removing the substrate from the first pulsed laser etching system, etching 906 portions of the first layer to form conductive traces separated by spaces. Without removing the substrate from the first pulsed laser etching system, etching 908 portions of the first layer and the substrate to form alignment holes. Without removing the substrate from the first pulsed laser etching system, laser etching 910 folding lines. Without removing the substrate from the first pulsed laser etching system, etching 912 portions to singulate the space transformer. It is noted that, in this illustrative embodiment, no realignment of the substrate (i.e., the workpiece) takes place between the various laser etching operations, and that the width of the spaces is less than the width of the conductive traces.

Conclusion

In accordance with the present invention, an integrated process for forming electrical structures provides improved dimensional accuracy and cost-effective manufacturing.

An advantage of some embodiments of the present invention is that extremely dense landscapes of conductors can be created which allow for the creation of electrical structures that can be significantly smaller in overall size than counterparts fabricated with conventional methods.

An advantage of some embodiments of the present invention is that the high density, which results from the ability to form very narrow spaces, allows electrical structures to be formed with less material than would be consumed by conventional fabrication methods.

Among the products which can readily be made by practice of the present invention, are uniquely structured devices, such as space transformers. Moreover, single-layer space transformers, are formable and capable of handling space-transformer requirements for devices which heretofore have had to be dealt with by more complicated, expensive, and difficult to manufacture, multi-layer assemblies. Single-layer space transformer structures uniquely created by embodiments of the present invention, are very much in that category of offering the opportunity to present to the end user a very simply manufactured, relatively inexpensively created, high-density, single-manufacturing-step component which can be made easily, economically and selectively both in very small quantities and in much larger batches if required.

It is to be understood that the present invention is not limited to the embodiments described above, but encompasses any and all embodiments within the scope of the claims.

What is claimed is:

1. A method of making an electrical structure, comprising:
preparing a database;
placing a substrate in a first laser processing system, the substrate comprising an electrically insulating material and a first blanket layer of conductive material disposed on a first surface thereof;
forming at least one fiducial by laser etching;
removing portions of the conductive material by laser etching so as to form isolated conductive traces;
laser etching at least one alignment hole suitable for receiving therethrough at least one alignment pin;
laser etching at least one folding line; and
singulating the electrical structure;
wherein forming the at least one fiducial, removing portions of the conductive material; etching the at least one alignment hole; etching at least one folding line; and singulating the electrical structure are all performed within the first laser processing system.

2. The method of claim 1, wherein forming the at least one fiducial, removing portions of the conductive material; laser etching the at least one alignment hole; laser etching at least one folding line; and singulating the electrical structure are all performed within the first laser processing system without removing the substrate from the laser processing system until the singulation operation is complete.

3. The method of claim 1, wherein the conductive material comprises copper.

4. The method of claim 1, wherein forming at least one fiducial comprises removing portions of the conductive material.

5. The method of claim 4, wherein forming at least one fiducial further comprises removing portions of the substrate.

6. The method of claim 1, wherein the database is communicatively coupled to the laser processing system so as to provide control signals that direct at least a portion of a plurality of operations of the laser processing system to the laser processing system.

7. The method of claim 5, wherein the electrical structure is a space transformer.

8. The method of claim 5, wherein the substrate comprises a material selected from the group consisting of FR-4, epoxy, and polyimide.

9. The method of claim 5, wherein the substrate comprises a board suitable as a printed circuit board.

10. The method of claim 5, wherein the substrate comprises a flexible material suitable for flex circuits.

11. The method of claim 6, wherein a second layer of conductive material is disposed on a second surface of the substrate.

12. The method of claim 6, wherein the substrate comprises at least one conductive trace formed therein.

13. The method of claim 6, wherein the singulated electrical structure is a single-chip package.

14. The method of claim 6, wherein the singulated electrical structure is a multichip package.

15. The method of claim 3, further comprising removing a portion of a passivation layer disposed on the copper, wherein the copper underlying the removed portion of the passivation layer remains substantially unremoved.

16. A method of making an electrical structure, comprising: providing an insulating substrate having a first major surface and a second major surface opposite the first major surface, with a layer of metal disposed on the first major surface; and removing, by laser etching, at least one portion of the layer of metal so as to form at least one trace and at least one space adjacent thereto; wherein the at least one trace has a height, a width, and a first aspect ratio (height/width); and the at least one space has a height, a width, and a second aspect ratio (height/width), and wherein the second aspect ratio is greater than the first aspect ratio, the trace comprises copper, the height of the conductive trace is in the range of 9 to 72 microns, the second aspect ratio is in the range of 0.75 to 50, and wherein the laser etching is performed in a first laser etching system, further comprising forming at least one fiducial, and at least one alignment hole, without removing the substrate from the first laser etching system, and without realigning the substrate within the first laser etching system.

17. The method of claim 16, further comprising forming at least one bar code, without removing the substrate from the first laser etching system, and without realigning the substrate within the first laser etching system.

18. The method of claim 17, further comprising forming at least one folding line, without removing the substrate from the first laser etching system, and without realigning the substrate within the first laser etching system.

19. The method of claim 16, further comprising forming at least one passivation opening.

20. A method of forming a space transformer, comprising:

placing a substrate with a first major surface and a second major surface, the substrate comprising an electrically insulating material, and a first layer of material disposed on the first major surface, into a first pulsed laser etching system;

etching, with the first pulsed laser etching system, portions of the first layer and portions of the substrate to form at least one fiducial;

without removing the substrate from the first pulsed laser etching system, etching portions of the first layer to form conductive traces separated by spaces;

without removing the substrate from the first pulsed laser etching system, etching portions of the first layer and the substrate to form alignment holes;

without removing the substrate from the first pulsed laser etching system, laser etching folding lines; and without removing the substrate from the first pulsed laser etching system, etching portions to singulate the space transformer;

wherein the width of the spaces is less than the width of the conductive traces.

21. The method of claim 20, further comprising the first laser etching system receiving control information from a database, wherein the control information directs at least a portion of the etching by the first pulsed laser etching system with respect to the coordinates of a material to be etched.

22. The method of claim 21, wherein the coordinates of the material to be etched are selected from a single coordinate system, independent of the feature formed by the etching.

23. The method of claim 20, wherein etching comprises:

exposing a first portion of the first material to a first laser pulse, the first portion determined by a first set of coordinates of a first coordinate system;

exposing a second portion of the first material to a second laser pulse, the second portion determined by a second set of coordinates of the first coordinate system; and exposing a third portion of the first material to a third laser pulse, the third portion determined by the third set of coordinates of the first coordinate system.

24. The method of claim 20, wherein exposing the first portion to the third laser pulse occurs subsequent to exposing the second portion to the second laser pulse.

25. The method of claim 20, wherein exposing the first portion to the third laser pulse occurs prior to exposing the second portion to the second laser pulse.

26. The method of claim 20, wherein etching comprises:

exposing a first coordinate position of the first material to a first laser pulse;

exposing a second coordinate position of the first material to a second laser pulse; and exposing at least a portion of a third coordinate position of the first material to a third laser pulse.

27. The method of 26, wherein exposing the at least a portion of the first coordinate position of the first material to the third laser pulse occurs subsequent to exposing the second coordinate position of the first material to the second laser pulse.

28. The method of claim 26, wherein exposing the at least a portion of the first coordinate position of the first material to the third laser pulse occurs prior to exposing the second coordinate position of the first material to the second laser pulse.

29. The method of claim 22, further comprising forming, by laser etching, at least one graphical symbol from the first layer of material.

30. The method of claim 29, wherein the at least one graphical symbol is a bar code.

31. The method of claim 22, further comprising removing at least one portion of an adhesive layer, the adhesive layer disposed between the first material and the substrate, the at least one portion corresponding to a region defined by an overlying space, wherein removing the at least one portion of the adhesive layer is performed without removing the substrate from the first laser etching system, and without realignment of the substrate.

* * * * *